(12) United States Patent
Fang et al.

(10) Patent No.: US 11,887,995 B2
(45) Date of Patent: Jan. 30, 2024

(54) DISPLAY PANEL

(71) Applicant: SHENZHEN CHINA STAR OPTOELECTRONICS SEMICONDUCTOR DISPLAY TECHNOLOGY CO., LTD., Shenzhen (CN)

(72) Inventors: Shaomao Fang, Shenzhen (CN); Ilgon Kim, Shenzhen (CN); Bin Zhao, Shenzhen (CN); Xin Zhang, Shenzhen (CN); Jun Zhao, Shenzhen (CN)

( * ) Notice: Subject to any disclaimer, the term of this patent is extended or adjusted under 35 U.S.C. 154(b) by 834 days.

(21) Appl. No.: 16/970,982

(22) PCT Filed: Apr. 23, 2020

(86) PCT No.: PCT/CN2020/086376
§ 371 (c)(1),
(2) Date: Aug. 19, 2020

(87) PCT Pub. No.: WO2021/189587
PCT Pub. Date: Sep. 30, 2021

(65) Prior Publication Data
US 2023/0127024 A1    Apr. 27, 2023

(30) Foreign Application Priority Data
Mar. 22, 2020 (CN) .......................... 202010204830.1

(51) Int. Cl.
*H01L 27/12* (2006.01)
*G02B 5/20* (2006.01)

(52) U.S. Cl.
CPC .......... *H01L 27/1248* (2013.01); *G02B 5/201* (2013.01)

(58) Field of Classification Search
CPC ........................... H01L 27/1248; G02B 5/201
See application file for complete search history.

(56) References Cited

U.S. PATENT DOCUMENTS

| | | | |
|---|---|---|---|
| 2014/0118666 A1 | 5/2014 | Lee | |
| 2017/0017125 A1* | 1/2017 | Wang | ................ G02F 1/134309 |
| 2020/0042766 A1* | 2/2020 | Yang | ................... H01L 27/1443 |

FOREIGN PATENT DOCUMENTS

| | | |
|---|---|---|
| CN | 101546073 A | 9/2009 |
| CN | 202182997 U | 4/2012 |
| CN | 105093627 A | 11/2015 |
| CN | 105137683 A | 12/2015 |
| CN | 106647053 A | 5/2017 |
| CN | 109683402 A | 4/2019 |
| CN | 109856849 A | 6/2019 |
| CN | 110646967 A | 1/2020 |

* cited by examiner

*Primary Examiner* — Monica D Harrison
*Assistant Examiner* — Andre C Stevenson (57) ABSTRACT

A display panel is provided and includes a substrate and a plurality of pixel units. Each of the pixel units includes a color resist block, a light transmission area, and a non-light transmission area. An opening is defined at an edge of the color resist block in the non-light transmission area, and a through-hole area is defined in the opening. The opening includes a first sidewall near the light transmission area, a compensation member is disposed at an end of the first sidewall near a gap area, and a block angle structure is formed between the compensation member and the first sidewall.

20 Claims, 12 Drawing Sheets

DISPLAY PANEL

FIELD

The present disclosure relates to the field of display technologies, and more particularly, relates to a display panel.

BACKGROUND

Figure 1:
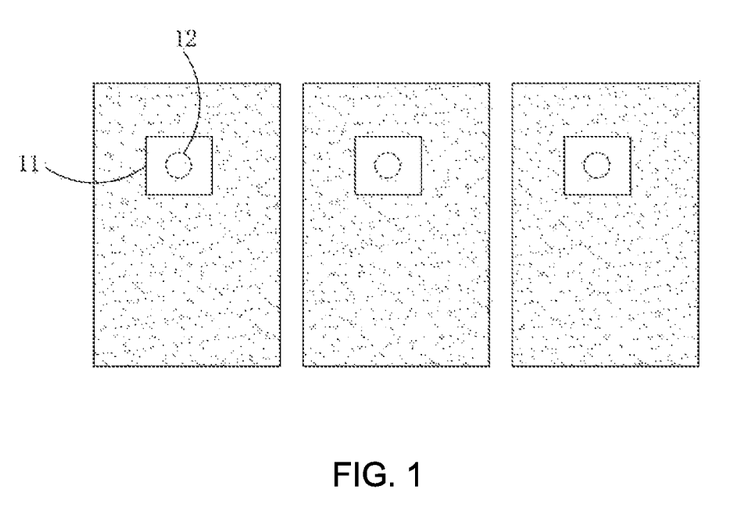
FIG. 1 is a schematic view showing a distribution of openings and through holes in a conventional low-resolution display panel.

With development of flat display technologies, high-resolution display panels (8K or more) have become a trend in panel industry. As shown in FIG. 1, in color filter on array (COA) products, which have a color filter integrated on an array substrate, metal layers positioned at different levels need to be connected to each other by a through hole. To conveniently define a through hole 12 passing through a color resist block layer on a substrate, an opening 11 needs to be retained on the color resist block layer, and the through hole is defined at a middle area of the opening 11. In engineering design, sizes of the through hole 12 and the opening 11 and a distance between an edge of the through hole 12 and the opening 11 need to satisfy a certain requirement.

Figure 2:
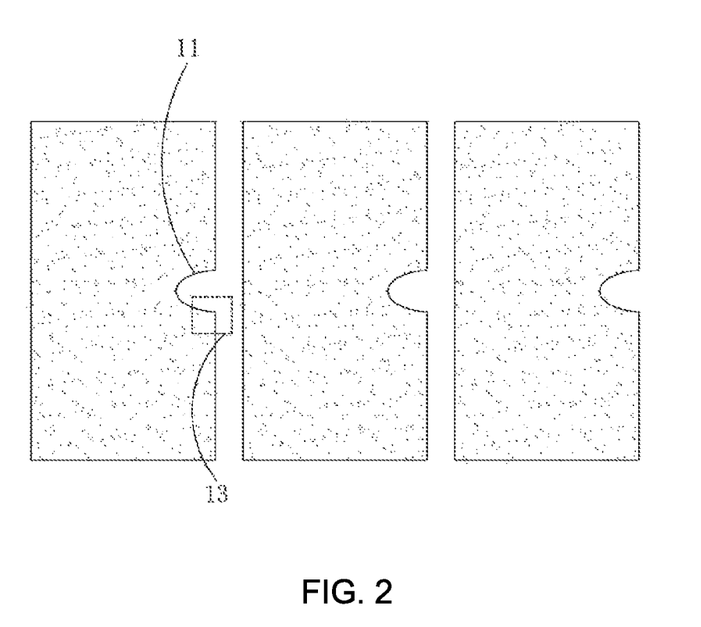
FIG. 2 is a schematic view showing a distribution of openings and through holes in a conventional high-resolution display panel.

Pixels in display panels with 8K or higher resolutions are far smaller than those in display panels with 4K resolutions, and therefore are more difficult to be designed. As shown in FIG. 2, since the pixels in display panels with 8K or higher resolutions are relatively small, the opening 11 can only be defined at an edge of a color resist block to satisfy size requirements of the through hole 12 and the opening 11.

However, because an A-area 13 is relatively close to a light transmission area and a color resist block disposed in the A-area 13 may be moved or stripped from the A-area 13 when the opening 11 is formed, an arc toward the light transmission area may be generated on the A-area 13, which affects a display effect of the light transmission area.

Regarding the technical problem: in conventional high-resolution display panels, an arc toward a light transmission area may be generated at an edge of an opening when the opening is formed, which affects a display effect of the light transmission area.

SUMMARY

In a first aspect, the present disclosure provides a display panel, including a substrate and a plurality of pixel units distributed on the substrate in an array manner, wherein each of the pixel units includes a color resist block, a gap area is defined between two adjacent color resist blocks in each row, each of the pixel units includes a light transmission area and a non-light transmission area, an opening is defined at an edge of the color resist block in the non-light transmission area, a through-hole area is defined in the opening, and a notch is defined at a side of the opening near the gap area.

The opening includes a first sidewall near the light transmission area, a compensation member is disposed on an end of the first sidewall near the gap area, and a block angle structure is formed between the compensation member and the first sidewall.

In some embodiments, a distance-increasing surface is disposed on a lateral side of the compensation member near the through-hole area, the shortest distance between the compensation member and the gap area is equal to the shortest distance between the distance-increasing surface and the through-hole area, and the shortest distance between the distance-increasing surface and the through-hole area is greater than or equal to a predetermined value.

In some embodiments, the compensation member includes a first lateral surface away from the first sidewall, and the distance-increasing surface extends from the first lateral surface to a direction away from the gap area and near the first sidewall.

In some embodiments, the distance-increasing surface includes at least one of an inclined surface or a curved surface.

In some embodiments, two opposite edges of the distance-increasing surface are respectively connected to the first lateral surface and the first sidewall.

In some embodiments, the compensation member further includes a second lateral surface away from the gap area, and two opposite edges of the distance-increasing surface are respectively connected to the first lateral surface and the second lateral surface.

In some embodiments, a plane where the second lateral surface is disposed is perpendicular to a plane where the first sidewall is disposed.

In some embodiments, the compensation member includes a third lateral surface near the gap area, and the third lateral surface is parallel to a lateral surface of the color resist block near the gap area.

In some embodiments, the through-hole area has a polygonal shape, and a first lateral edge of an outline of the through-hole area having the shortest distance to the distance-increasing surface is parallel to the distance-increasing surface.

In some embodiments, the through-hole area has a circular shape or an elliptical shape, and a tangent at a position of an outline of the through-hole area having the shortest distance to the distance-increasing surface is parallel to the distance-increasing surface.

In some embodiments, the light transmission area includes a main area and a secondary area, and the non-light transmission area is defined between the main area and the secondary area.

In some embodiments, the opening includes a second sidewall near the main area and a third sidewall near the secondary area, and both an end of the second sidewall near the gap area and an end of the third sidewall near the gap area include the compensation member.

In some embodiments, the compensation member is integrally formed with the color resist block.

In a second aspect, the present disclosure further provides a display panel, including a substrate and a plurality of pixel units distributed on the substrate in an array manner, wherein each of the pixel units includes a color resist block, a gap area is defined between two adjacent color resist blocks in each row, each of the pixel units includes a light transmission area and a non-light transmission area, an opening is defined at an edge of the color resist block in the non-light transmission area, a through-hole area is defined in the opening, and a notch is defined at a side of the opening near the gap area.

The opening includes a first sidewall near the light transmission area, a compensation member is disposed on an end of the first sidewall near the gap area, a block angle structure is formed between the compensation member and the first sidewall, the light transmission area includes a main area and a secondary area, and the non-light transmission area is defined between the main area and the secondary area.

In some embodiments, a distance-increasing surface is disposed on a lateral side of the compensation member near the through-hole area, the shortest distance between the compensation member and the gap area is equal to the shortest distance between the distance-increasing surface and the through-hole area, and the shortest distance between the distance-increasing surface and the through-hole area is greater than or equal to a predetermined value.

In some embodiments, the compensation member includes a first lateral surface away from the first sidewall, and the distance-increasing surface extends from the first lateral surface to a direction away from the gap area and near the first sidewall.

In some embodiments, the distance-increasing surface includes at least one of an inclined surface or a curved surface.

In some embodiments, two opposite edges of the distance-increasing surface are respectively connected to the first lateral surface and the first sidewall.

In some embodiments, the compensation member includes a third lateral surface near the gap area, and the third lateral surface is parallel to a lateral surface of the color resist block near the gap area.

In some embodiments, a plane where the second lateral surface is disposed is perpendicular to a plane where the first sidewall is disposed.

Regarding the beneficial effects: after an opening is formed on a color resist block by laser cutting or etching, a compensation member is formed at an end of a first sidewall near a gap area. A block angle structure formed between the compensation member and the first sidewall can prevent remaining color resist block materials in a flowing state from flowing toward a light transmission area, thereby preventing a display effect of the light transmission area from being affected by an arc toward the light transmission area formed at the first sidewall. Furthermore, by removing an upper left corner of the compensation member to form a distance-increasing surface, a distance between a through-hole area and an edge of the opening can be effectively enlarged. As a result, not only can the distance between the through-hole area and the edge of the opening satisfy a pixel design rule, but also the through-hole area can be effectively prevented from being blocked by an expanding color resist block due to fluidity.

DESCRIPTION OF DRAWINGS

Technical solutions and beneficial effects of the present disclosure are illustrated below in detail in conjunction with drawings and specific embodiments.

DETAILED DESCRIPTION

The following description of the various embodiments is provided with reference to the accompanying drawings to demonstrate the embodiments of the present disclosure. It should be understood that terms such as "upper," "lower," "front," "rear," "left," "right," "inside," "outside," "lateral" as well as derivative thereof should be construed to refer to the orientation as then described or as shown in the drawings under discussion. These relative terms are for convenience of description, do not require that the present disclosure be constructed or operated in a particular orientation, and shall not be construed as causing limitations to the present disclosure. In the drawings, the identical or similar reference numerals constantly denote the identical or similar elements or elements having the identical or similar functions.

In conventional high-resolution display panels, an arc toward the light transmission area may be generated at an edge of an opening when the opening is formed, which affects a display effect of the light transmission area. The present disclosure can solve the above technical problem.

First Embodiment

Figure 3:
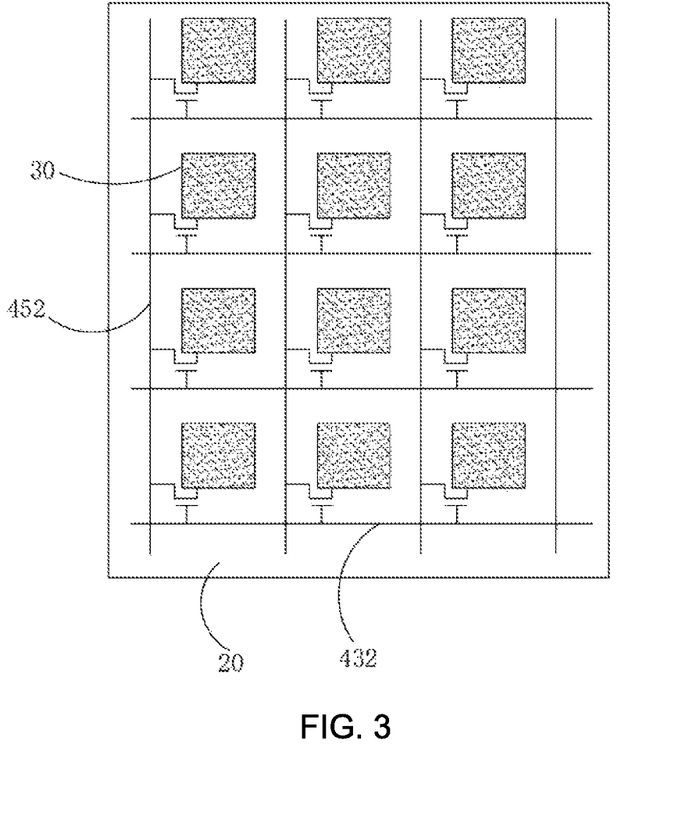
FIG. 3 is a schematic structural view showing a display panel according an embodiment of the present disclosure.

As shown in FIG. 3, the present embodiment provides a display panel, including a substrate 20, a plurality of scan lines 432 and a plurality of data lines 452 disposed on the substrate 20, and a plurality of pixel units 30 distributed on the substrate 20 in an array manner.

Specifically, the data lines 452 and the scan lines 432 are disposed in a crossing manner. The data lines 452 are disposed along a vertical direction and are spaced apart from each other along a horizontal direction. The scan lines 432 are disposed along the horizontal direction and are spaced apart from each other along the vertical direction. An area defined by two adjacent data lines 452 and two adjacent scan lines 432 is a pixel area where a single pixel unit 30 is disposed.

In one embodiment, one of the scan lines 432 corresponds to and is electrically connected to a row of the pixel units 30, thereby providing scan signals to the pixel units 30. One of the data lines 452 corresponds to and is electrically connected to a column of the pixel units 30, thereby providing data signals to the pixel units 30.

Figure 4:
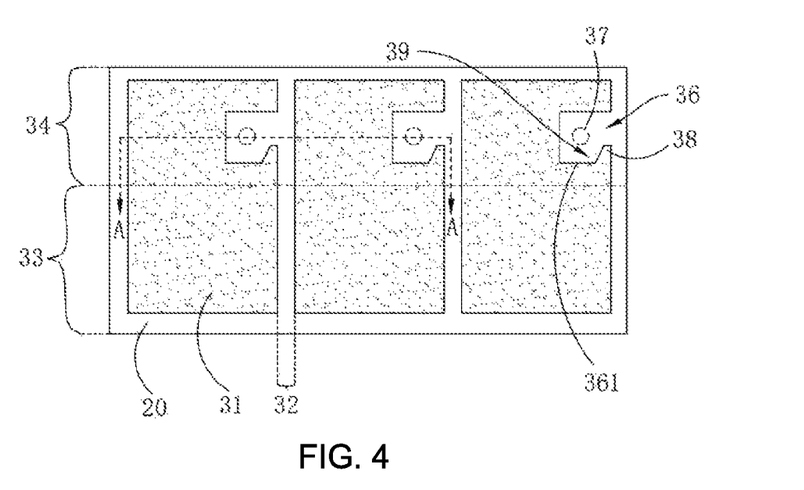
FIG. 4 is a first schematic structural view showing a display panel according to a first embodiment of the present disclosure.

Specifically, as shown in FIG. 4, each of the pixel units 30 includes a color resist block 31, and a gap area 32 is defined between two adjacent color resist blocks 31 in each row. The color resist block 31 may be a red color resist block 31, a green color resist block 31, or a blue color resist block 31.

Specifically, each of the pixel units 30 includes a light transmission area 33 and a non-light transmission area 34.

An opening 36 is defined in the non-light transmission area 34 at an edge of the color resist block 31, a through-hole area 37 is defined in the opening 36, and a notch is defined at a side of the opening 36 near the gap area 32.

It should be noted that the light transmission area 33 can be used to display an image. The non-light transmission area 34 is an area where a plurality of metal lines, such as connecting lines that are configured to transmit signals, are arranged. A metal layer above the color resist block 31 is electrically connected to a metal layer below the color resist block 31 by a through hole in the through-hole area 37. The opening 36 and the connecting lines are disposed in the non-light transmission area 34, thereby preventing an image displayed by the light transmission area 33 from being affected by metals and connecting lines in the through-hole area 37.

Specifically, the opening 36 includes a first sidewall 361 near the light transmission area 33. A compensation member 38 is disposed on an end of the first sidewall 361 near the gap area 32. A block angle structure 39 is formed between the compensation member 38 and the first sidewall 361.

It should be noted that after the opening 36 is formed on the color resist block 31 by laser cutting or etching, and the block angle structure 39 is formed between the compensation member 38 and the first sidewall 361, thereby preventing a liquefied color resist block from flowing toward the light transmission area 33, and preventing a display effect of the light transmission area 33 from being affected by an arc toward the light transmission area 33 formed at the first sidewall 361.

Figure 5:
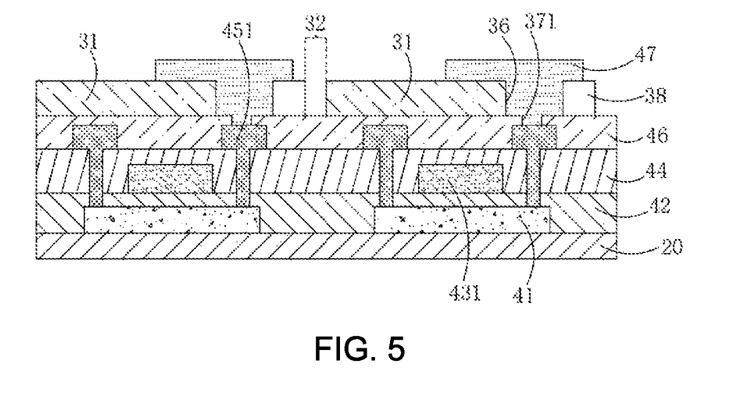
FIG. 5 is a sectional schematic structural diagram taken along sectional line AA in FIG. 4.

As shown in FIG. 4 and FIG. 5, in one embodiment, the display panel further includes an active layer 41 disposed on the substrate 20, a gate insulating layer 42 covering the active layer 41, a first metal layer disposed on the gate insulating layer 42, a first insulating layer 44 covering the first metal layer, a second metal layer disposed on the first insulating layer 44, and a second insulating layer 46 covering the second metal layer.

The first metal layer includes a plurality of gates 431 and the plurality of scan lines 432, and the second metal layer includes a plurality of sources/drains 451 and the plurality of data lines 452.

The color resist block 31 is disposed on the second insulating layer 46, and a pixel electrode 47 is disposed on the color resist block 31. The pixel electrode 47 penetrates the opening 36 of the color resist block and penetrates a through hole 371 of the second insulating layer 46 to be electrically connected to one of the sources/drains 451.

Figure 6:
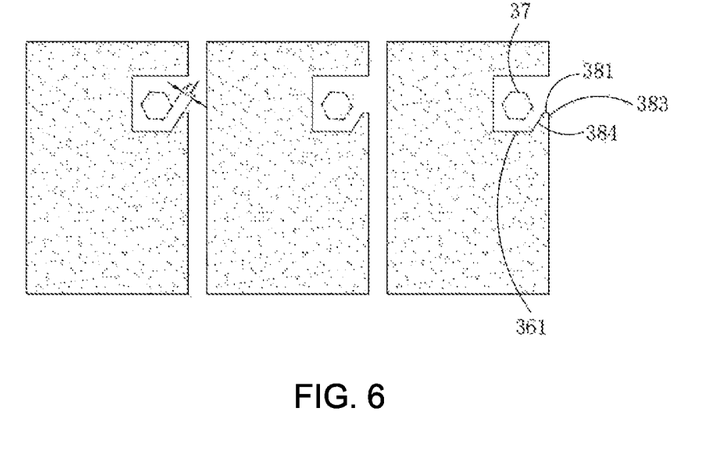
FIG. 6 is a first schematic structural view showing a color resist block according to the first embodiment of the present disclosure.

As shown in FIG. 6, a distance-increasing surface 384 is disposed on a lateral side of the compensation member 38 near the through-hole area 37, the shortest distance between the compensation member 38 and the gap area 32 is equal to the shortest distance between the distance-increasing surface 384 and the through-hole area 37, and the shortest distance between the distance-increasing surface 384 and the through-hole area 37 is greater than or equal to a predetermined value.

As shown in FIG. 6, the shortest distance between the distance-increasing surface 384 and the through-hole area 37 is d. For those skilled in the art, it is understood that a distance between the through-hole area 37 and an edge of the compensation member 38 can be effectively enlarged by disposing the distance-increasing surface 384 on the compensation member 38. The shortest distance between the through-hole area 37 and the compensation member 38 is equal to the shortest distance between the distance-increasing surface 384 and the through-hole area 37. As a result, not only can the distance between the through-hole area 37 and the edge of an opening 36 satisfy a pixel design rule, but also the through-hole area 37 can be effectively prevented from being blocked by an expanding color resist block due to fluidity.

The predetermined value may be 9 mm or may be decided according to practical size of a pixel, and the shortest distance between the distance-increasing surface 384 and the through-hole area 37 is ensured to be greater than or equal to the predetermined value according to a size of the distance-increasing surface 384. In actual applications, the shortest distance between the distance-increasing surface 384 and the through-hole area 37 may also be equal to the predetermined value.

Specifically, the compensation member 38 includes a first lateral surface 381 away from the first sidewall 361. The distance-increasing surface 384 extends from the first lateral surface 381 to a direction away from the gap area 32 and near the first sidewall 361.

It should be noted that the first lateral surface 381 is parallel to the first sidewall 361, and a distance between the first lateral surface 381 and the first sidewall 361 can be decided according to actual sizes of the opening 36 and the through-hole area 37.

Specifically, two opposite edges of the distance-increasing surface 384 are respectively connected to the first lateral surface 381 and the first sidewall 361. In other words, the distance-increasing surface 384 is a lateral side of the compensation member 38 away from the gap area 32.

As shown in FIG. 6, in one embodiment, the through-hole area 37 has a polygonal shape, and a first lateral edge of an outline of the through-hole area 37 having the shortest distance to the distance-increasing surface 384 is parallel to the distance-increasing surface 384.

Figure 7:
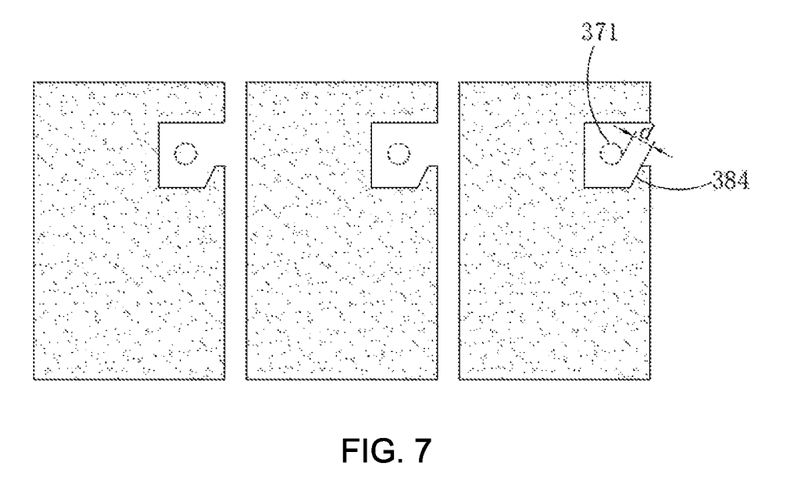
FIG. 7 is a second schematic structural view showing the color resist block according to the first embodiment of the present disclosure.

As shown in FIG. 7, in another embodiment, the through-hole area 37 has a circular shape or an elliptical shape, and a tangent at a position of an outline of the through-hole area 37 having the shortest distance to the distance-increasing surface 384 is parallel to the distance-increasing surface 384.

It should be noted that the distance-increasing surface 384 is designed according to an entire shape of the through-hole area 37, thereby better increasing a distance.

Figure 8:
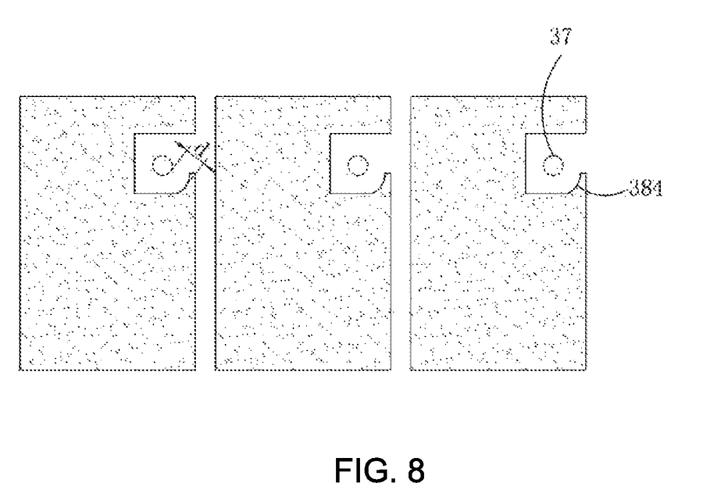
FIG. 8 is a third schematic structural view showing the color resist block according to the first embodiment of the present disclosure.

As shown in FIGS. 6 to 8, specifically, the distance-increasing surface 384 includes at least one of an inclined surface or a curved surface, thereby retaining sufficient space for a liquified color resist block. Therefore, in the opening 36, an included angle formed between the compensation member 38 and the first sidewall 361 is a right angle or may be a near right angle, thereby improving a display effect.

As shown in FIG. 6 and FIG. 7, in one embodiment, the distance-increasing surface 384 is an inclined surface connecting the first lateral surface 381 with the first sidewall 361. An included angle between a plane where the inclined surface is disposed and a plane where the first sidewall 361 is disposed is greater than 90 degrees but less than 180 degrees. In actual applications, the included angle between the plane where the included surface is disposed and the plane where the first sidewall 361 is disposed may also be greater than 120 degrees but less than 150 degrees.

As shown in FIG. 8, in another embodiment, the distance-increasing surface 384 is a curved surface connecting the first lateral surface 381 with the first sidewall 361.

It should be noted that FIG. 8 only shows that the distance-increasing surface 384 is a concave curved surface. In actual applications, the increasing surface 384 may also be a convex curved surface.

It should be noted that FIGS. 6 to 8 only shows that the distance-increasing surface 384 only includes one inclined surface or one curved surface. In actual applications, the distance-increasing surface 384 may also be formed from a plurality of inclined surfaces connected to each other, a plurality of curved surfaces connected to each other, or at least one inclined surface and at least one curved surface connected to each other.

Specifically, the compensation member 38 includes a third lateral surface 383 near the gap area 32. The third lateral surface 383 is parallel to a lateral surface of the color resist block 31 near the gap area 32, thereby preventing other components from being affected by the compensation member 38 protruding to the gap area 32.

It should be noted that a width of the compensation member 38 (an interval between the third lateral surface 383 and the distance-increasing surface 384) may be decided according to materials and actual sizes of the pixels, thereby ensuring that the compensation member 38 can have a good protective effect, and ensuring that a distance between the through-hole area 37 and the compensation member 38 can satisfy a design requirement.

It should be noted that in actual applications, the opposite edges of the distance-increasing surface 384 may also be respectively connected to the third lateral surface 383 and the first sidewall 361. Meanwhile, a shape of a vertical cross-sectional surface of the compensation block 38 is triangular.

Figure 9:
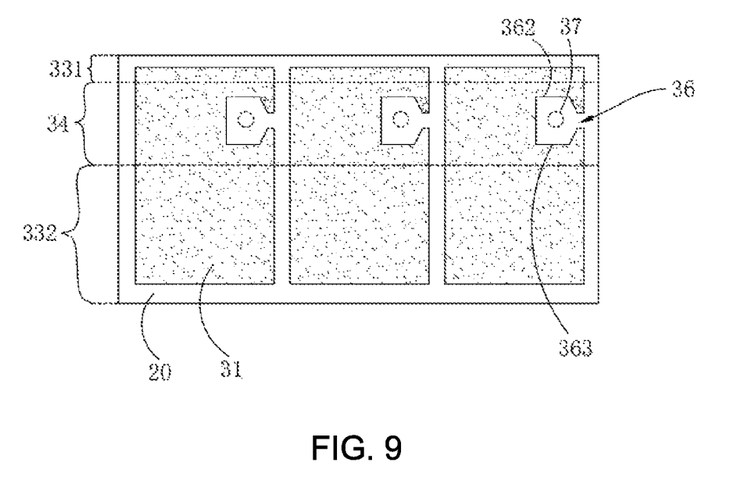
FIG. 9 is a second schematic structural view showing the display panel according to the first embodiment of the present disclosure.

In one embodiment, as shown in FIG. 9, the light transmission area 33 includes a main area 331 and a secondary area 332, and the non-light transmission area 34 is defined between the main area 331 and the secondary area 332.

The opening 36 includes a second sidewall 362 near the main area 331 and a third sidewall 363 near the secondary area 332, and both an end of the second sidewall 362 near the gap area 32 and an end of the third sidewall 363 near the gap area 32 have the compensation member 38.

Specifically, the compensation member 38 may be integrally formed with the color resist block 31. Alternatively, the compensation member 38 may also be disposed at the end of the first sidewall 361 near the gap area 32 after the opening 36 is formed on the color resist block 31. Materials of the compensation member 38 and materials of the color resist block 31 may be the same or different.

It should be noted that a lateral surface of the compensation member 38 near the substrate 20 is parallel to a lateral surface of the color resist block 31 near the substrate 20. In a direction perpendicular to a surface of the substrate, a thickness of the compensation member 38 may be greater than or equal to a thickness of the color resist block 31. In actual applications, the thickness of the compensation member 38 may also be less than the thickness of the color resist block 31 as long as it can prevent a liquified color resist block from flowing toward the light transmission area 33.

Second Embodiment

Figure 10:
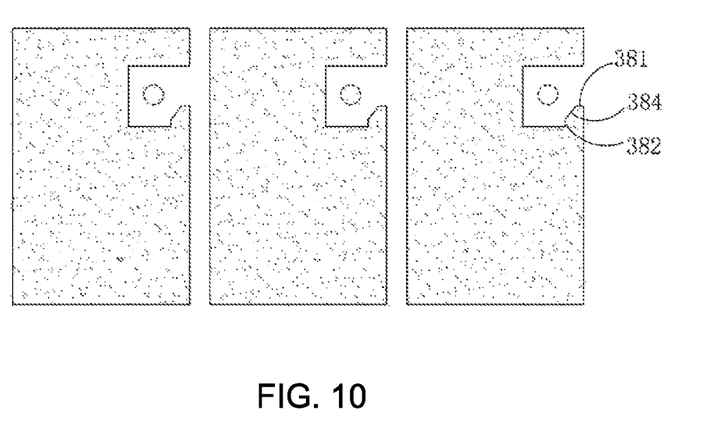
FIG. 10 is a first schematic structural view showing a color resist block according to a second embodiment of the present disclosure.

FIG. 10 shows a display panel, and a difference between the first embodiment and the second embodiment is a position where the distance-increasing area 384 is defined.

Specifically, the compensation member 38 further includes a second lateral surface 382 away from the gap area 32, and two opposite edges of the distance-increasing surface 384 are respectively connected to the first lateral surface 381 and the second lateral surface 382.

Furthermore, a plane where the second lateral surface 382 is disposed and a plane where the first sidewall 361 is disposed are perpendicular to each other, thereby further preventing the first sidewall 361 from forming an arc toward the light transmission area 33 during a forming process of the opening 36.

Third Embodiment

Figure 11:
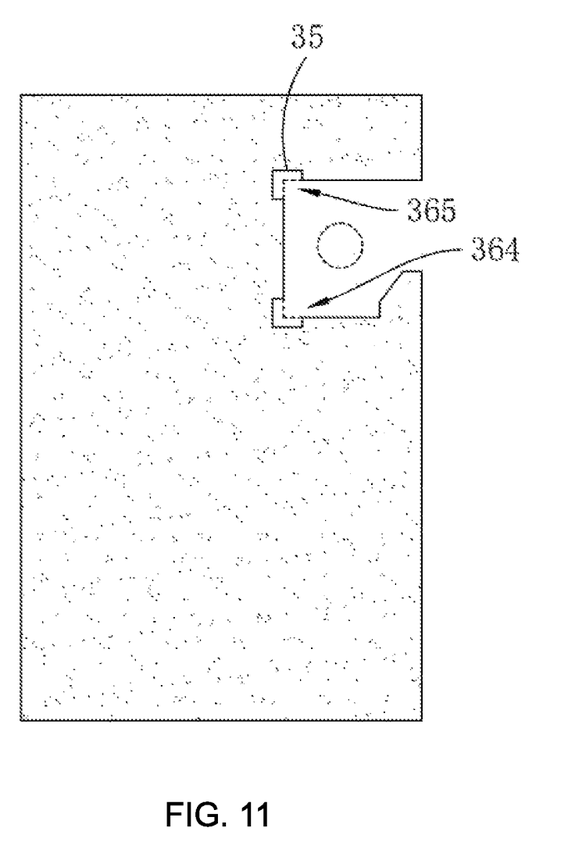
FIG. 11 is a first schematic structural view showing a color resist block according to a third embodiment of the present disclosure.

FIG. 11 shows a display panel, and a difference between the first embodiment and the third embodiment is: in the third embodiment, the opening 36 further includes a first angle 364 and a second angle 365, which are defined away from the gap area 32. A compensation hole 35 is defined at an area where at least one of the first angle 364 or the second angle 365 is defined, and the compensation hole 35 is connected to the gap area 32.

It should be noted that the first angle 364 and the second angle 365 are respectively defined at two adjacent corners of the opening 36. By defining the compensation hole 35 at the corners of the opening 36 away from the gap area 32, a remaining color resist block material can flow into and fill the compensation hole 35 when the opening 36 is formed on the color resist block 31 by laser cutting or etching. Therefore, the corners of the opening 36 away from the gap area 32 can be formed to be a right angle or a near right angle, and patterns at the corners of the opening 36 can be closer to what was predetermined.

In one embodiment, the first angle 364 is defined near the light transmission area 33. Meanwhile, the compensation hole 35 may be defined at only the area where the first angle 364 is defined, so that patterns at the first angle 364 are closer to what was predetermined, and a remaining color resist block material can be prevented from flowing toward the light transmission area 33.

It should be noted that the compensation hole 35 may also be defined at both the area where the first angle 364 is defined and the area where the second angle 365 is defined.

In another embodiment, the light transmission area 33 includes a main area 331 and a secondary area 332, the non-light transmission area 34 is defined between the main area 331 and the secondary area 332, and both the area where the first angle 364 is defined and the area where the second angle 365 is defined include the compensation hole 35.

It should be noted that an entire shape of the compensation hole 35 may be trapezoidal, sectoral, or square. Alternatively, the entire shape of the compensation hole 35 may be decided according to a practical situation. For example, if there are too many remaining color resist block materials but a length of a lateral edge of the compensation hole 35 is determined, the shape of the compensation hole 35 may be sectoral with a greater area.

It should be noted that a size of the compensation hole 35 may also be adjusted according to a specific compensation effect. Generally, the size of the compensation hole 35 is proportional to a size of the opening 36. That is, the greater the size of the opening 36, the greater the size of the compensation hole 35.

Figure 12:
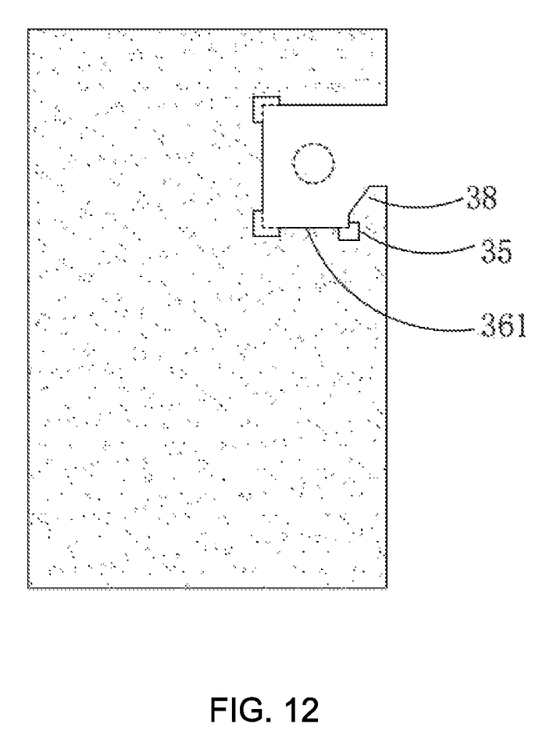
FIG. 12 is a second schematic structural view showing the color resist block according the third embodiment of the present disclosure.

As shown in FIG. 12, it should be noted that the compensation hole 35 may also be defined at a corner between the first sidewall 361 and the compensation member 38, thereby preventing remaining color resist block materials in a flowing state from flowing toward the light transmission area 33, and preventing a display effect of the light transmission area 33 from being affected by an arc toward the light transmission area 33 formed on the first sidewall 361.

Furthermore, the corner between the first sidewall 361 and the compensation member 38 may be a right corner or a near right corner.

Regarding the beneficial effects: after an opening is formed on a color resist block by laser cutting or etching, a compensation member is formed at an end of a first sidewall near a gap area. A block angle structure formed between the compensation member and the first sidewall can prevent remaining color resist block materials in a flowing state from flowing toward a light transmission area, thereby preventing a display effect of the light transmission area from being affected by an arc toward the light transmission area formed at the first sidewall. Furthermore, by removing an upper left corner of the compensation member to form a distance-increasing surface, a distance between a through-hole area and an edge of the opening can be effectively enlarged. As a result, not only can the distance between the through-hole area and the edge of the opening satisfy a pixel design rule, but also the through-hole area can be effectively prevented from being blocked by an expanding color resist block due to fluidity.

In the above embodiments, the focus of each embodiment is different, and for a part that is not detailed in an embodiment, reference may be made to related descriptions of other embodiments.

Principles and implementations are illustrated by embodiments provided by the present disclosure. However, the description of the above embodiments is only for helping to understand the technical solution of the present disclosure and core ideas thereof, and it is understood by those skilled in the art that many changes and modifications to the described embodiment can be carried out without departing from the scope and the spirit of the disclosure that is intended to be limited only by the appended claims.

What is claimed is:

1. A display panel, comprising a substrate and a plurality of pixel units distributed on the substrate in an array manner, wherein each of the pixel units comprises a color resist block, a gap area is defined between two adjacent color resist blocks in each row, each of the pixel units comprises a light transmission area and a non-light transmission area, an opening is defined at an edge of the color resist block in the non-light transmission area, a through-hole area is defined in the opening, and a notch is defined at a side of the opening near the gap area; and wherein the opening comprises a first sidewall near the light transmission area, a compensation member is disposed on an end of the first sidewall near the gap area, and a block angle structure is formed between the compensation member and the first sidewall.

2. The display panel of claim 1, wherein a distance-increasing surface is disposed on a lateral side of the compensation member near the through-hole area, a shortest distance between the compensation member and the gap area is equal to a shortest distance between the distance-increasing surface and the through-hole area, and the shortest distance between the distance-increasing surface and the through-hole area is greater than or equal to a predetermined value.

3. The display panel of claim 2, wherein the compensation member comprises a first lateral surface away from the first sidewall, and the distance-increasing surface extends from the first lateral surface to a direction away from the gap area and near the first sidewall.

4. The display panel of claim 3, wherein the distance-increasing surface comprises at least one of an inclined surface or a curved surface.

5. The display panel of claim 4, wherein two opposite edges of the distance-increasing surface are respectively connected to the first lateral surface and the first sidewall.

6. The display panel of claim 4, wherein the compensation member further comprises a second lateral surface away from the gap area, and two opposite edges of the distance-increasing surface are respectively connected to the first lateral surface and the second lateral surface.

7. The display panel of claim 6, wherein a plane where the second lateral surface is disposed is perpendicular to a plane where the first sidewall is disposed.

8. The display panel of claim 4, wherein the compensation member comprises a third lateral surface near the gap area, and the third lateral surface is parallel to a lateral surface of the color resist block near the gap area.

9. The display panel of claim 2, wherein the through-hole area has a polygonal shape, and a first lateral edge of an outline of the through-hole area having the shortest distance to the distance-increasing surface is parallel to the distance-increasing surface.

10. The display panel of claim 2, wherein the through-hole area has a circular shape or an elliptical shape, and a tangent at a position of an outline of the through-hole area having the shortest distance to the distance-increasing surface is parallel to the distance-increasing surface.

11. The display panel of claim 1, wherein the light transmission area comprises a main area and a secondary area, and the non-light transmission area is defined between the main area and the secondary area.

12. The display panel of claim 11, wherein the opening comprises a second sidewall near the main area and a third sidewall near the secondary area, and both an end of the second sidewall near the gap area and an end of the third sidewall near the gap area comprise the compensation member.

13. The display panel of claim 1, wherein the compensation member is integrally formed with the color resist block.

14. A display panel, comprising a substrate and a plurality of pixel units distributed on the substrate in an array manner, wherein each of the pixel units comprises a color resist block, a gap area is defined between two adjacent color resist blocks in each row, each of the pixel units comprises a light transmission area and a non-light transmission area, an opening is defined at an edge of the color resist block in the non-light transmission area, a through-hole area is defined in the opening, and a notch is defined at a side of the opening near the gap area; and wherein the opening comprises a first sidewall near the light transmission area, a compensation member is disposed on an end of the first sidewall near the gap area, a block angle structure is formed between the compensation member and the first sidewall, the light transmission area comprises a main area and a secondary area, and the non-light transmission area is defined between the main area and the secondary area.

15. The display panel of claim 14, wherein a distance-increasing surface is disposed on a lateral side of the compensation member near the through-hole area, a shortest distance between the compensation member and the gap area is equal to a shortest distance between the distance-increasing surface and the through-hole area, and the shortest distance between the distance-increasing surface and the through-hole area is greater than or equal to a predetermined value.

16. The display panel of claim 15, wherein the compensation member comprises a first lateral surface away from the first sidewall, and the distance-increasing surface extends from the first lateral surface to a direction away from the gap area and near the first sidewall.

17. The display panel of claim 16, wherein the distance-increasing surface comprises at least one of an inclined surface or a curved surface.

18. The display panel of claim 17, wherein two opposite edges of the distance-increasing surface are respectively connected to the first lateral surface and the first sidewall.

19. The display panel of claim 17, wherein the compensation member further comprises a second lateral surface away from the gap area, and two opposite edges of the distance-increasing surface are respectively connected to the first lateral surface and the second lateral surface.

20. The display panel of claim 19, wherein a plane where the second lateral surface is disposed is perpendicular to a plane where the first sidewall is disposed.

* * * * *